US009503160B1

(12) United States Patent
Hyde

(10) Patent No.: US 9,503,160 B1
(45) Date of Patent: Nov. 22, 2016

(54) LOW-NOISE AMPLIFIER MIXER WITH COUPLED INDUCTORS

(71) Applicant: Impinj, Inc., Seattle, WA (US)

(72) Inventor: John D. Hyde, Corvallis, OR (US)

(73) Assignee: IMPINJ INC., Seattle, WA (US)

( * ) Notice: Subject to any disclaimer, the term of this patent is extended or adjusted under 35 U.S.C. 154(b) by 0 days.

(21) Appl. No.: 14/946,793

(22) Filed: Nov. 20, 2015

Related U.S. Application Data

(60) Provisional application No. 62/083,107, filed on Nov. 21, 2014.

(51) Int. Cl.
*H04B 1/04* (2006.01)
*H04B 5/00* (2006.01)
*H04K 3/00* (2006.01)
*G06K 7/10* (2006.01)
*H03H 7/38* (2006.01)
*H03F 3/193* (2006.01)

(52) U.S. Cl.
CPC ......... *H04B 5/0087* (2013.01); *G06K 7/10009* (2013.01); *H03F 3/193* (2013.01); *H03H 7/38* (2013.01); *H04B 5/0062* (2013.01); *H04K 3/228* (2013.01); *H04K 3/86* (2013.01); *H03F 2200/294* (2013.01); *H03F 2200/451* (2013.01); *H04K 2203/20* (2013.01)

(58) Field of Classification Search
CPC ...... H04B 1/38; H01Q 1/2225; H01Q 1/248; H01Q 23/00; G06K 19/07754; G06K 19/07756; G06K 19/0713; G06K 19/073; G06K 19/0726; G06K 19/07718; G06K 19/07796; G06K 7/10297; H03J 2200/00
See application file for complete search history.

(56) References Cited

U.S. PATENT DOCUMENTS

| 9,087,282 | B1* | 7/2015 | Hyde | G06K 19/0726 |
| 2008/0252459 | A1* | 10/2008 | Butler | G06K 7/0008 340/572.1 |
| 2008/0300027 | A1* | 12/2008 | Dou | H03G 3/3042 455/574 |
| 2015/0324681 | A1* | 11/2015 | Mats | G06K 19/07766 235/492 |

* cited by examiner

*Primary Examiner* — Thanh Le
(74) *Attorney, Agent, or Firm* — Turk IP Law, LLC

(57) ABSTRACT

A Radio Frequency Identification (RFID) reader configured to perform self-jammer cancellation (SJC) may include an SJC module coupled to a low-noise amplifier (LNA), which in turn may be coupled to a mixer via an LNA-mixer interface. The interface may be implemented with a horizontal matching circuit that includes four inductors magnetically and direct-current (DC) coupled to each other. In some embodiments, the inductors may each be implemented using a different segment of a single inductor.

15 Claims, 8 Drawing Sheets

LOW-NOISE AMPLIFIER MIXER WITH COUPLED INDUCTORS

CROSS REFERENCE TO RELATED APPLICATIONS

This application claims the benefit of U.S. Provisional Patent Application Ser. No. 62/083,107 filed on Nov. 21, 2014. The disclosures of the above application are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to inventory one or more RFID tags, where inventorying involves at least singulating a tag and receiving an identifier from the singulated tag. "Singulated" is defined as a reader singling-out one tag, potentially from among multiple tags, for a reader-tag dialog. "Identifier" is defined as a number identifying the tag or the item to which the tag is attached, such as a tag identifier (TID), electronic product code (EPC), etc. The reader transmitting a Radio-Frequency (RF) wave performs the interrogation. The RF wave is typically electromagnetic, at least in the far field. The RF wave can also be predominantly electric or magnetic in the near or transitional near field. The RF wave may encode one or more commands that instruct the tags to perform one or more actions.

In typical RFID systems, an RFID reader transmits a modulated RF inventory signal (a command), receives a tag reply, and transmits an RF acknowledgement signal responsive to the tag reply. A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a time, a destination, an encrypted message, an electronic signature, other attribute(s), any combination of attributes, and so on. Accordingly, when a reader receives tag data it can learn about the item that hosts the to and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to horizontal low-noise amplifier (LNA) mixer interfaces in Radio Frequency Identification (RFID) readers. An RFID reader configured to perform self-jammer cancellation (SJC) may include an SJC module coupled to an LNA, which in turn may be coupled to a mixer via an LNA-mixer interface. The interface may be implemented with a horizontal matching circuit that includes four inductors magnetically and direct-current (DC) coupled to each other. In some embodiments, the inductors may each be implemented using a different segment of a single inductor.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions, and includes one or more tag instructions preceded by a command identifier or command code that identifies the command and/or the tag instructions. "Instruction" refers to a request to a tag to perform a single explicit action (e.g., write data into memory). "Program" refers to a request to a tag to perform a set or sequence of instructions (e.g., read a value from memory and, if the read value is less than a threshold then lock a memory word). "Protocol" refers to an industry standard for communications between a reader and a tag (and vice versa), such as the Class-I Generation-2 UHF RFID Protocol for Communications at 860 MHz-960 MHz by GSI EPCglobal, Inc. ("Gen2 Specification"), versions 1.2.0 and 2.0 of which are hereby incorporated by reference.

Figure 1:
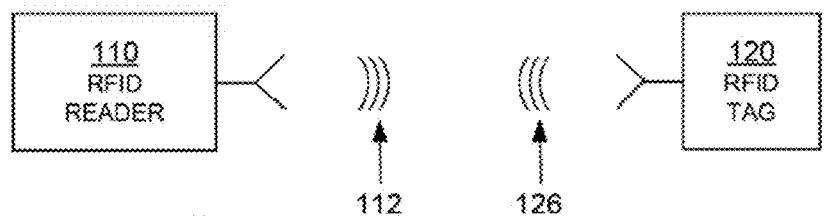
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals)

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
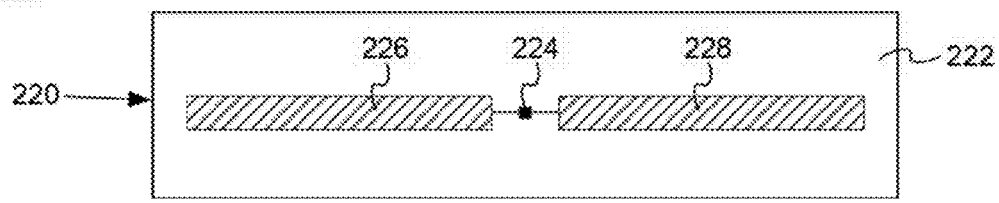
FIG. 2 is a diagram showing components of a passive RFID tag, such as a tag that can be used in the system of FIG. 1.
Figure 2:
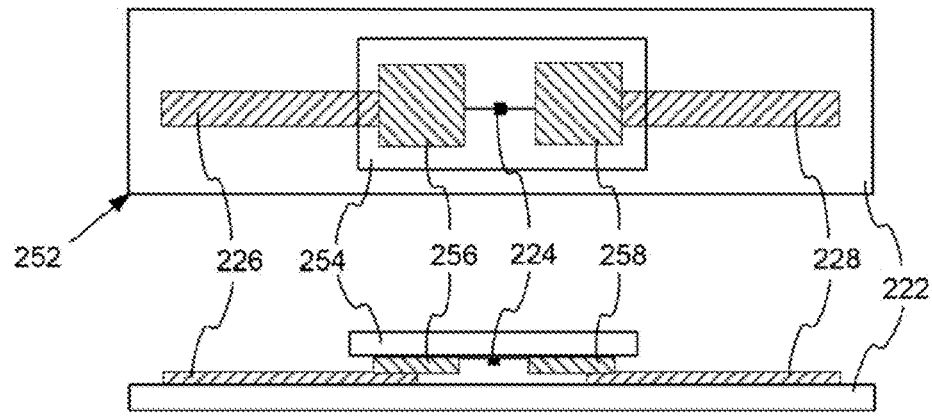
Figure 2:
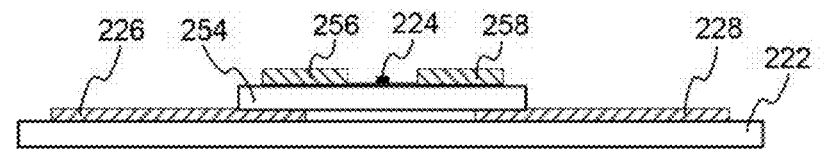

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein means that electrical coupling of one or more types (e.g., galvanic, capacitive, and/or inductive) is not present, at least to the extent possible. For example, elements that are electrically isolated from each other are galvanically isolated from each other, capacitively isolated from each other, and/or inductively isolated from each other. Of course, electrically isolated components will generally have some unavoidable stray capacitive or inductive coupling between them, but the intent of the isolation is to minimize this stray coupling to a negligible level when compared with an electrically coupled path.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments the positions of strap substrate 254 and inlay 222 may be reversed, with strap substrate 254 mounted beneath inlay 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance.

In the embodiments of FIG. 2, antenna segments 226 and 228 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

The components of the RFID system of FIG. 1 may communicate with each other in any number of modes. One such mode is called full duplex. Another such mode is called half-duplex, and is described below.

Figure 3:
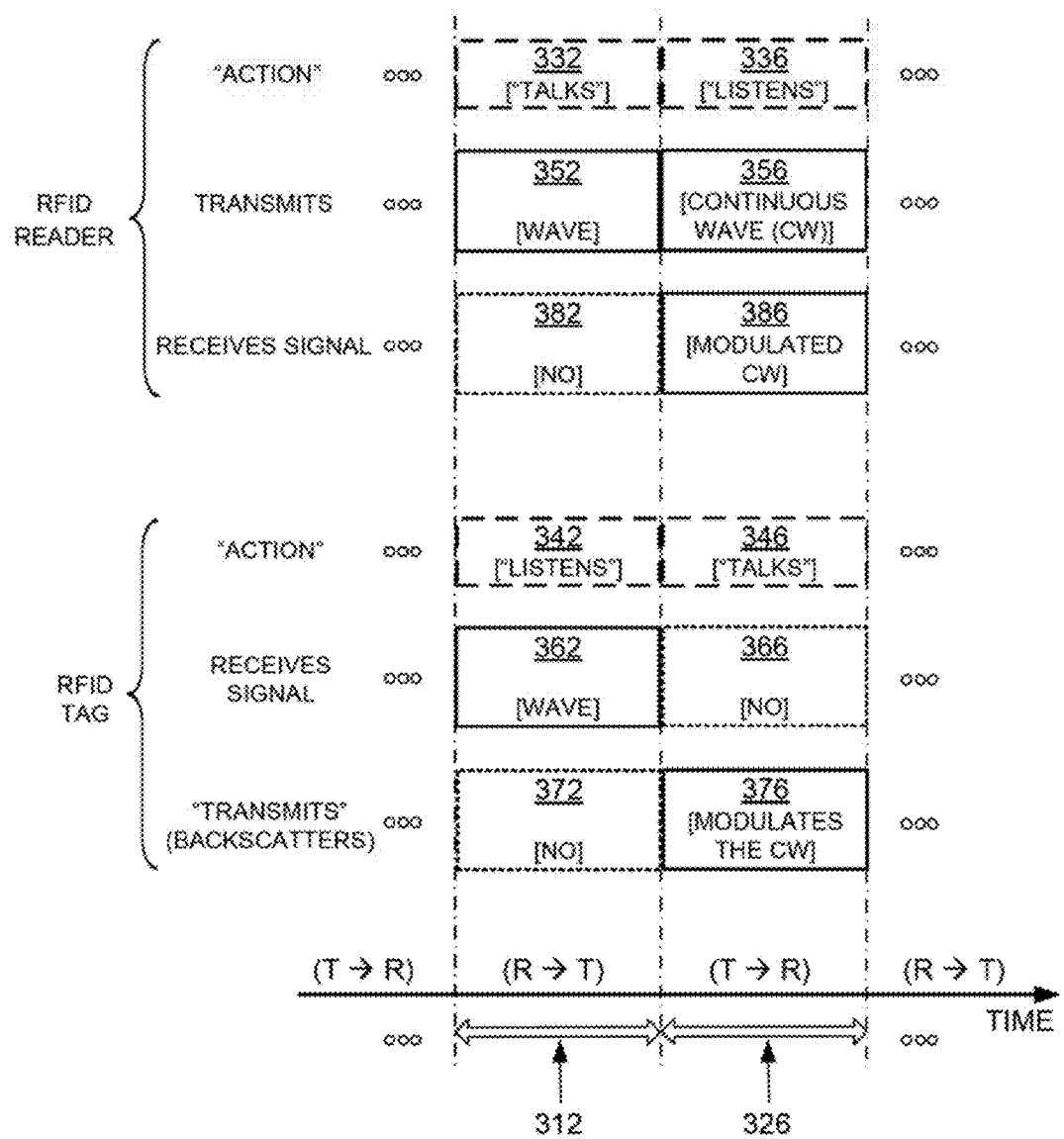
FIG. 3 is a conceptual diagram for explaining a half-duplex mode of communication between the components of the RFID system of FIG. 1.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
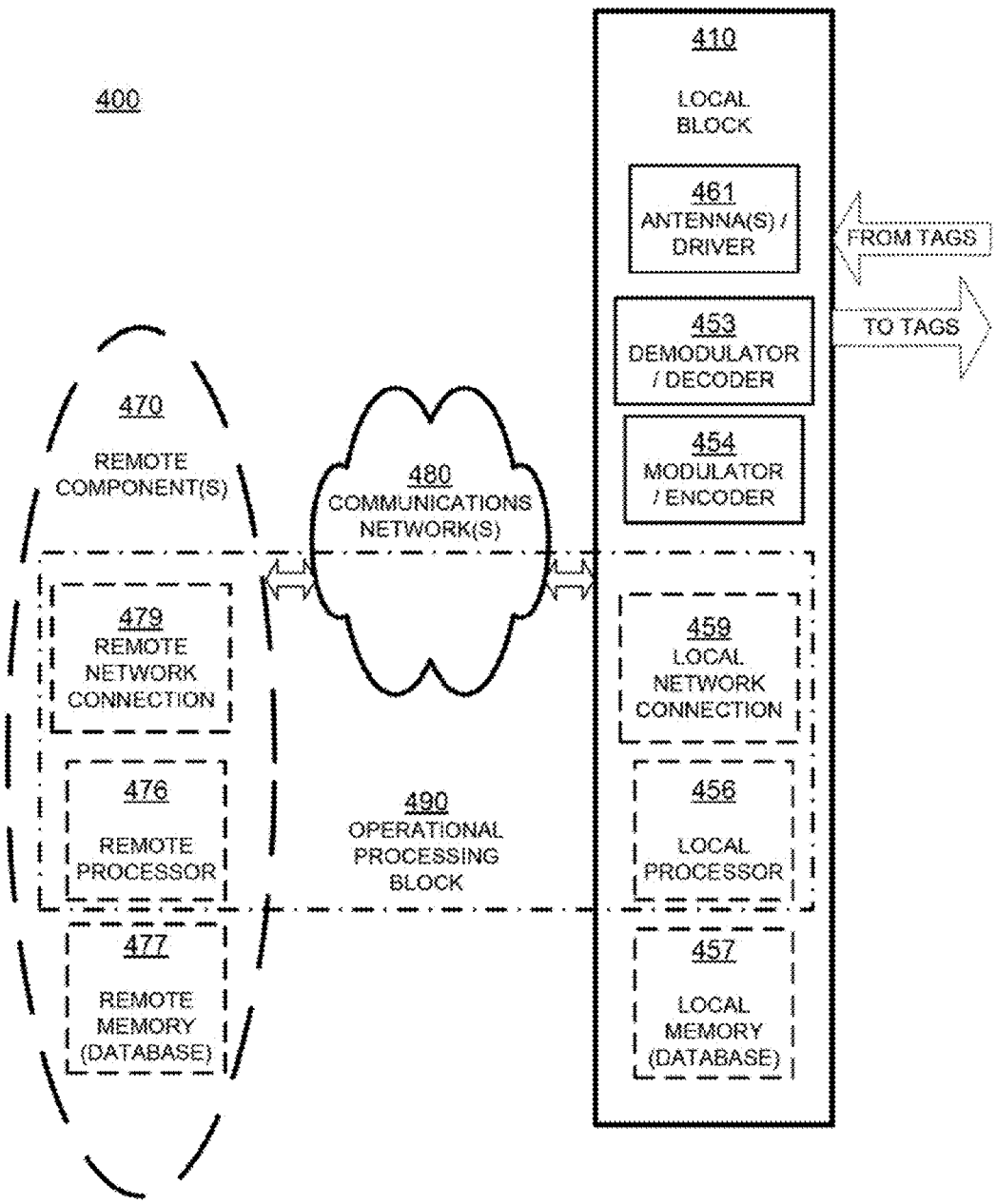
FIG. 4 is a block diagram showing a detail of an RFID reader system, such as the one shown in FIG. 1.

FIG. 4 is a block diagram of an RFID reader system 400 according to embodiments. RFID reader system 400 includes a local block 410, and optionally remote components 470. Local block 410 and remote components 470 can be implemented in any number of ways. It will be recognized that RFID reader 110 of FIG. 1 is the same as local block 410, if remote components 470 are not provided. Alternately, RFID reader 110 can be implemented instead by RFID reader system 400, of which only the local block 410 is shown in FIG. 1.

In some embodiments, one or more of the blocks or components of reader system 400 may be implemented as integrated circuits. For example, local block 410, one or more of the components of local block 410, and/or one or more of the remote component 470 may be implemented as integrated circuits using CMOS technology, BJT technology, MESFET technology, and/or any other suitable implementation technology.

Local block 410 is responsible for communicating with the tags. Local block 410 includes a block 451 of an antenna and a driver of the antenna for communicating with the tags. Some readers, like that shown in local block 410, contain a single antenna and driver. Some readers contain multiple antennas and drivers and a method to switch signals among them, including sometimes using different antennas for transmitting and for receiving. Some readers contain multiple antennas and drivers that can operate simultaneously. A demodulator/decoder block 453 demodulates and decodes backscattered waves received from the tags via antenna/driver block 451. Modulator/encoder block 454 encodes and modulates an RF wave that is to be transmitted to the tags via antenna/driver block 451.

Local block 410 additionally includes an optional local processor 456. Local processor 456 may be implemented in any number of ways known in the art. Such ways include, by way of examples and not of limitation, digital and/or analog processors such as microprocessors and digital-signal processors (DSPs); controllers such as microcontrollers; software running in a machine such as a general purpose computer; programmable circuits such as Field Programmable Gate Arrays (FPGAs), Field-Programmable Analog Arrays (FPAAs), Programmable Logic Devices (PLDs), Application Specific Integrated Circuits (ASIC), any combination of one or more of these; and so on. In some cases, some or all of the decoding function in block 453, the encoding function in block 454, or both, may be performed instead by local processor 456. In some cases local processor 456 may implement an encryption or authentication function; in some cases one or more of these functions can be distributed among other blocks such as encoding block 454, or may be entirely incorporated in another block.

Local block 410 additionally includes an optional local memory 457. Local memory 457 may be implemented in any number of ways known in the art, including, by way of example and not of limitation, any of the memory types described above as well as any combination thereof. Local memory 457 can be implemented separately from local processor 456, or in an IC with local processor 456, with or without other components. Local memory 457, if provided, can store programs for local processor 456 to run, if needed.

In some embodiments, local memory 457 stores data read from tags, or data to be written to tags, such as Electronic Product Codes (EPCs), Tag Identifiers (TIDs) and other data. Local memory 457 can also include reference data that is to be compared to EPCs, instructions and/or rules for how to encode commands for the tags, modes for controlling antenna 451, secret keys, key pairs, and so on. In some of these embodiments, local memory 457 is provided as a database.

Some components of local block 410 typically treat the data as analog, such as the antenna driver block 451. Other components such as local memory 457 typically treat the data as digital. At some point there is a conversion between analog and digital. Based on where this conversion occurs, a reader may be characterized as "analog" or "digital", but most readers contain a mix of analog and digital functionality.

If remote components 470 are provided, they are coupled to local block 410 via an electronic communications network 480. Network 480 can be a Local Area Network (LAN), a Metropolitan Area Network (MAN), a Wide Area Network (WAN), a network of networks such as the internet, or a local communication link, such as a USB, PCI, and so on. Local block 410 may include a local network connection 459 for communicating with communications network 480. Communications on the network can be secure, such as if they are encrypted or physically protected, or insecure if they are not encrypted or otherwise protected.

There can be one or more remote component(s) 470. If more than one, they can be located at the same location, or in different locations. They can access each other and local block 410 via communications network 480, or via other similar networks, and so on. Accordingly, remote component(s) 470 can use respective remote network connections. Only one such remote network connection 479 is shown, which is similar to local network connection 459, etc.

Remote component(s) 470 can also include a remote processor 476. Remote processor 476 can be made in any way known in the art, such as was described with reference to local processor 456. Remote processor 476 may also implement an authentication function, similar to local processor 456.

Remote component(s) 470 can also include a remote memory 477. Remote memory 477 can be made in any way known in the art, such as was described with reference to local memory 457. Remote memory 477 may include a local database, and a different database of a standards organization, such as one that can reference EPCs. Remote memory 477 may also contain information associated with commands, tag profiles, keys, or the like, similar to local memory 457.

Of the above-described elements, it may be useful to consider a combination of these components, designated as operational processing block 490. Operational processing block 490 includes those components that are provided of the following: local processor 456, remote processor 476, local network connection 459, remote network connection 479, and by extension an applicable portion of communications network 480 that links remote network connection 479 with local network connection 459. The portion can be dynamically changeable, etc. In addition, operational processing block 490 can receive and decode RF waves received via antenna/driver 451, and cause antenna/driver 451 to transmit RF waves according to what it has processed.

Operational processing block 490 includes either local processor 456, or remote processor 476, or both. If both are provided, remote processor 476 can be made such that it operates in a way complementary with that of local processor 456. In fact, the two can cooperate. It will be appreciated that operational processing block 490, as defined this way, is in communication with both local memory 457 and remote memory 477, if both are present.

Accordingly, operational processing block 490 is location independent, in that its functions can be implemented either by local processor 456, or by remote processor 476, or by a combination of both. Some of these functions are preferably implemented by local processor 456, and some by remote processor 476. Operational processing block 490 accesses local memory 457, or remote memory 477, or both for storing and/or retrieving data.

RFID reader system 400 operates by operational processing block 490 generating communications for RFID tags. These communications are ultimately transmitted by antenna/driver block 451, with modulator/encoder block 454 encoding and modulating the information on an RF wave. Then data is received from the tags via antenna/driver block 451, demodulated and decoded by demodulator/decoder block 453, and processed by operational processing block 490.

Embodiments of an RFID reader system can be implemented as hardware, software, firmware, or any combination. Such a system may be subdivided into components or modules. A person skilled in the art will recognize that some of these components or modules can be implemented as hardware, some as software, some as firmware, and some as a combination. An example of such a subdivision is now described, together with the RFID tag as an additional module.

Figure 5:
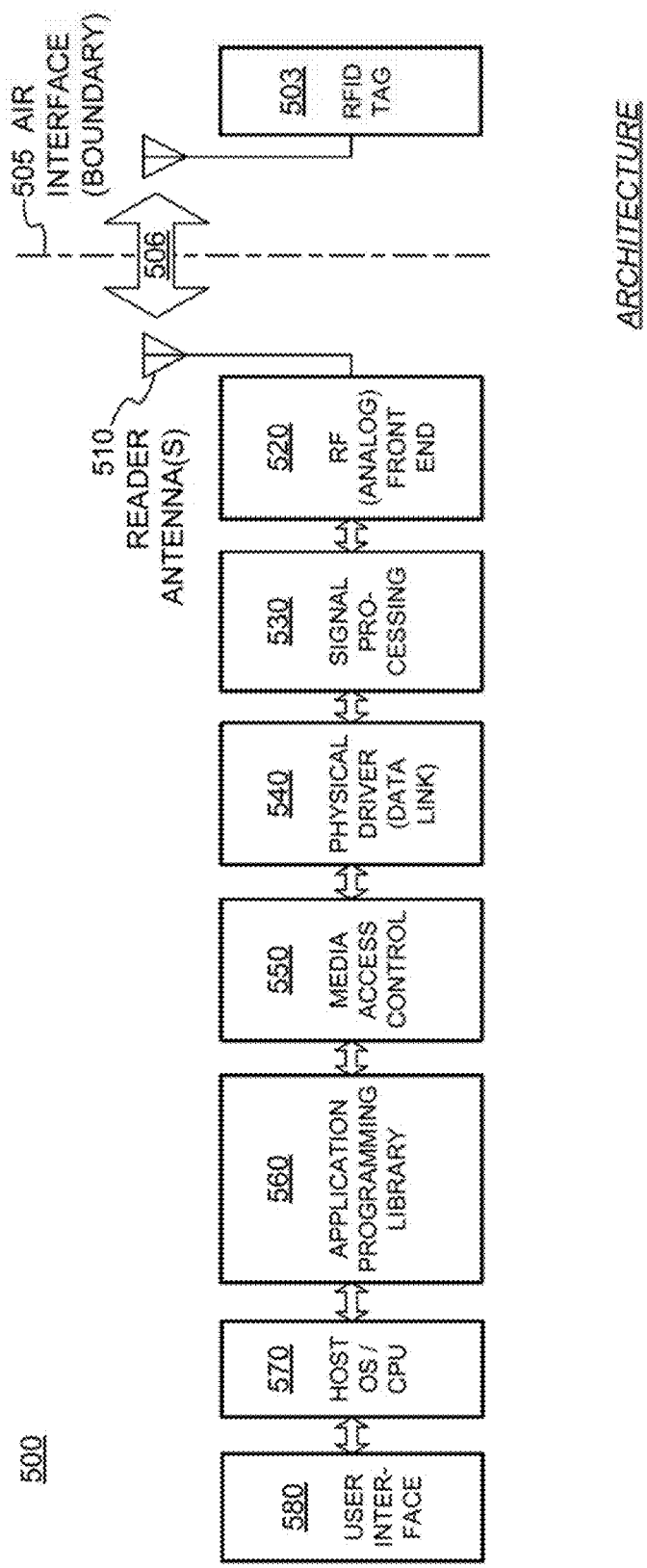
FIG. 5 is a block diagram illustrating an overall architecture of an RFID system according to embodiments.

FIG. 5 is a block diagram illustrating an overall architecture of an RFID system 500 according to embodiments. RFID system 500 may be subdivided into modules or components, each of which may be implemented by itself or in combination with others. In addition, some of them may be present more than once. Other embodiments may be equivalently subdivided into different modules. Some aspects of FIG. 5 are parallel with systems, modules, and components described previously.

An RFID tag 503 is considered here as a module by itself. RFID tag 503 conducts a wireless communication 506 with the remainder, via the air interface 505. Air interface 505 is really a boundary, in that signals or data that pass through it are not intended to be transformed from one thing to another. Specifications as to how readers and tags are to communicate with each other, for example the Gen2 Specification, also properly characterize that boundary as an interface.

RFID system 500 includes one or more reader antennas 510, and an RF front-end module 520 for interfacing with reader antenna(s) 510. These can be made as described above.

RFID system 500 also includes a signal-processing module 530. In one embodiment, signal-processing module 530 exchanges waveforms with RF front-end module 520, such as I and Q waveform pairs.

RFID system 500 also includes a physical-driver module 540, which is also known as data-link module. In some embodiments physical-driver module 540 exchanges bits with signal-processing module 530. Physical-driver module 540 can be the stage associated with the framing of data.

RFID system 500 additionally includes a media access control module 550. In one embodiment, media access control layer module 550 exchanges packets of bits with physical driver module 540. Media access control layer module 550 can make decisions for sharing the medium of wireless communication, which in this case is the air interface.

RFID system 500 moreover includes an application-programming library-module 560. This module 560 can include application programming interfaces (APIs), other objects, etc.

All of these RFID system functionalities can be supported by one or more processors. One of these processors can be considered a host processor. Such a host processor might include a host operating system (OS) and/or central processing unit (CPU), as in module 570. In some embodiments, the processor is not considered as a separate module, but one that includes some of the above-mentioned modules of RFID system 500. In some embodiments the one or more processors may perform operations associated with retrieving data that may include a tag public key, an electronic signature, a tag identifier, an item identifier, and/or a signing-authority public key. In some embodiments the one or more processors may verify an electronic signature, create a tag challenge, and/or verify a tag response.

User interface module 580 may be coupled to application-programming-library module 560, for accessing the APIs. User interface module 580 can be manual, automatic, or both. It can be supported by the host OS/CPU module 570 mentioned above, or by a separate processor, etc.

It will be observed that the modules of RFID system 500 form a chain. Adjacent modules in the chain can be coupled by appropriate instrumentalities for exchanging signals. These instrumentalities include conductors, buses, interfaces, and so on. These instrumentalities can be local, e.g. to connect modules that are physically close to each other, or over a network, for remote communication.

The chain is used in one direction for receiving RFID waveforms and in the other direction for transmitting RFID waveforms. In receiving mode, reader antenna(s) 510 receives wireless waves, which are in turn processed successively by the various modules in the chain. Processing can terminate in any one of the modules. In transmitting mode, waveform initiation can be in any one of the modules. Ultimately, signals are routed to reader antenna(s) 510 to be transmitted as wireless waves.

The architecture of RFID system 500 is presented for purposes of explanation, and not of limitation. In particular, subdivision into modules need not be followed for creating embodiments. Furthermore, the features of the present disclosure can be performed either within a single one of the modules, or by a combination of them.

Figure 6:
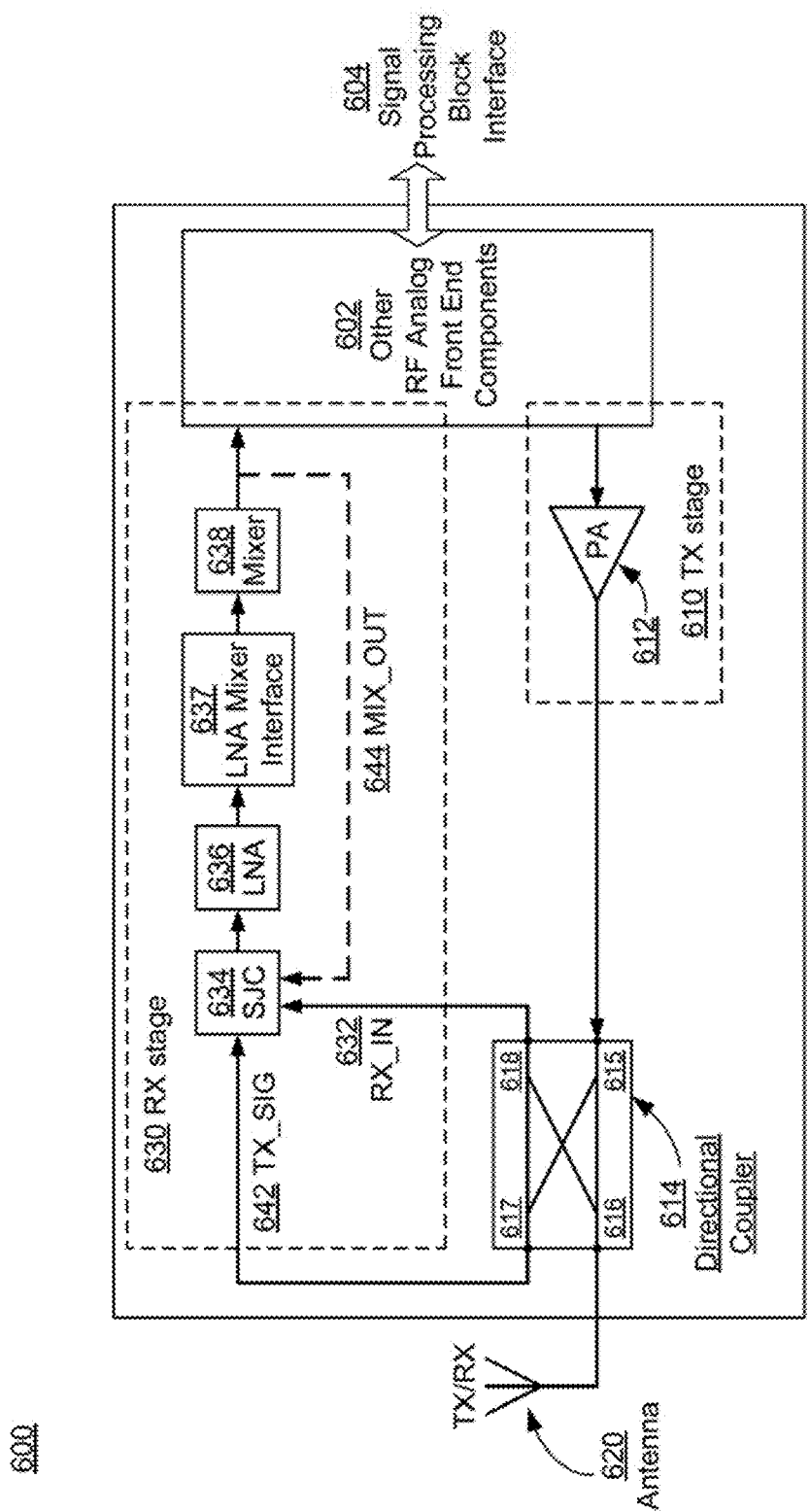
FIG. 6 illustrates an RFID reader RF analog front end where self-jammer cancellation methods may be implemented.

FIG. 6 illustrates an RFID reader RF analog front end 600 where self-jammer cancellation methods may be implemented. RF analog front end (RFE) 600 may include an antenna 620 coupled to transmit (TX) stage 610 and receive (RX) stage 630. TX stage 610 includes at least power amplifier (PA) 612, and in some embodiments may also include one or more additional components from other RF analog front end components 602. RX stage 630 may include self-jammer cancellation (SJC) module 634, low-noise amplifier (LNA) module 636, LNA-mixer interface 637, receive mixer module 638, and/or one or more additional components from components 602. Components 602 in turn may be coupled to signal processing block interface 604, which may be coupled to a signal processing block such as signal processing module 530. In some implementations PA 612 may be included in an integrated circuit that also may include RX stage 630 and/or other components. In other implementations all or part of PA 612 may be external to an integrated circuit that contains RX stage 630.

Antenna 620 may be coupled to TX stage 610 and RX stage 630 via directional coupler 614, which may act to isolate TX stage 610 from RX stage 630. Directional coupler 614 may be an RF device configured to conduct RF power between port 615 and port 616, and to couple reduced power from port 615 to port 617 and from port 616 to port 618. Port 618 is isolated from port 615 and port 617 is isolated from port 616. In many implementations directional coupler 614 may be external to an integrated circuit that also may include RX stage 630 and/or other components.

In RF analog front end 600, directional coupler 614 may couple the output of PA 612 to antenna 620 (connected via ports 615 and 616) while isolating the output of PA 612 from input signal RX_IN 632 of RX stage 630 (connected via port 618 which is isolated from port 615). In addition, directional coupler 614 may couple signals received from antenna 620 to input signal RX_IN 632 of RX stage 630 (coupled from port 616 to port 618).

As depicted in FIG. 3, a reader may transmit a continuous wave (CW) signal to one or more tags during tag-to-reader communications. The CW signal may provide a responding tag with operating power and may serve as a carrier signal for the tag to modulate with response data and backscatter to the reader. In situations where a single antenna is used for transmit and receive functionalities, as is the case for RF analog front end 600, some of the transmitted CW signal may be reflected from the antenna 620 back through directional coupler 614 to RX stage 630. As a result, RX stage 630 may receive an input signal RX_IN 632 formed from a combination of this reflected CW signal (referred to as a "self-jammer" or an "unwanted carrier signal" [UCS]) and one or more backscattered tag responses (referred to as "signals-of-interest" or SOI). In some situations, the UCS may be significantly stronger (in other words, have larger signal amplitude) than the SOI, and the amplitude of input signal RX_IN 632 may be dominated by the UCS amplitude. The UCS amplitude in turn limits the maximum gain that can be used by LNA 636 for amplifying RX_IN 632 without causing significant signal compression, thereby limiting the amplification of the SOI in RX_IN 632 and degrading receiver signal-to-noise ratio (SNR) and sensitivity compared to a UCS-free input signal. In some situations, the UCS may also introduce amplitude-modulated (AM) noise from the transmit path or TX stage 610.

In some embodiments, the effects of the UCS may be at least partially mitigated by attenuating the UCS amplitude using self-jammer cancellation (SJC). SJC may be performed by creating a replica of the UCS having substantially equal amplitude as the UCS and opposite in phase to the UCS and summing the replica with the input signal RX_IN 632. Since the replica and the UCS have substantially the same amplitude but opposite phase, they cancel each other, resulting in a signal that is substantially just the SOI, or at least a signal in which the amplitude ratio between the UCS and the SOI is substantially reduced compared to the UCS-SOI amplitude ratio in the original RX_IN 632.

In some embodiments, SJC module 634 may perform SJC using a received input signal RX_IN 632 and a transmitted signal TX_SIG 642. SJC module 634 may receive RX_IN 632 from antenna 620 via directional coupler 614 (port 618 coupled from port 616), and may receive TX_SIG 642 from PA 612 via directional coupler 614 (port 617 coupled from port 615). In some embodiments, SJC module 634 may also use a mixer signal MIX_OUT 644 received from mixer 638 for self-jammer cancellation. The signal output from SJC module 634, with reduced or eliminated UCS amplitude, may then be passed to LNA 636 (which may be a common-gate or common-source LNA) for amplification, then passed on through LNA-mixer interface 637 for subsequent processing at mixer 638, other RF analog front end components 602, and then through signal processing block interface 604.

As described above, a signal output from a SJC module (e.g., SJC module 634) may be passed to an LNA (e.g., LNA 636) for amplification, then passed on for subsequent processing at a mixer (e.g., mixer 638). In some embodiments, SJC may be performed by summing an SJC signal (e.g., a UCS replica as described above) with the input signal (e.g., the input signal RX_IN 632 described above) at the source nodes of a common-gate LNA, whose output may then be coupled to a mixer. In other embodiments, a common-source LNA may be used instead. A common-gate LNA provides signal gain from the source terminal to the drain terminal of a metal-oxide semiconductor (MOS) transistor with its gate terminal connected to a reference potential, whereas a common-source LNA provides signal gain from the gate terminal to the drain terminal of a MOS transistor with its source terminal connected to a reference potential. In situations where sufficient high supply voltage (commonly referred to as $V_{dd}$) is available, the LNA and mixer may be arranged in a vertically-stacked structure in which the LNA output current flows directly into the mixer input. Vertically stacking the LNA and mixer may reduce circuit complexity, by not requiring an interface circuit such as LNA-mixer interface 637, and may reduce supply current consumption, by using the same supply current for both the LNA and mixer. However, stacking the mixer above the LNA may increase the required supply voltage by at least the additional voltage required for the mixer, and may also increase the contribution of mixer noise to RFE noise figure by inherently limiting the current gain of the LNA to mixer interface to a gain of one. If $V_{dd}$ is relatively low, then vertical stacking may not be feasible, because the relatively-low $V_{dd}$ may not be sufficient to provide the additional supply voltage required for the mixer. In this situation, LNA-mixer interface 637, which may have a horizontal configuration, may be used to accommodate the relatively-low $V_{dd}$. In some embodiments, such a horizontal interface may be passive to avoid adding noise to the system, and also may provide gain in order to reduce the noise figure (NF) impact of noise from the mixer.

Figure 7:
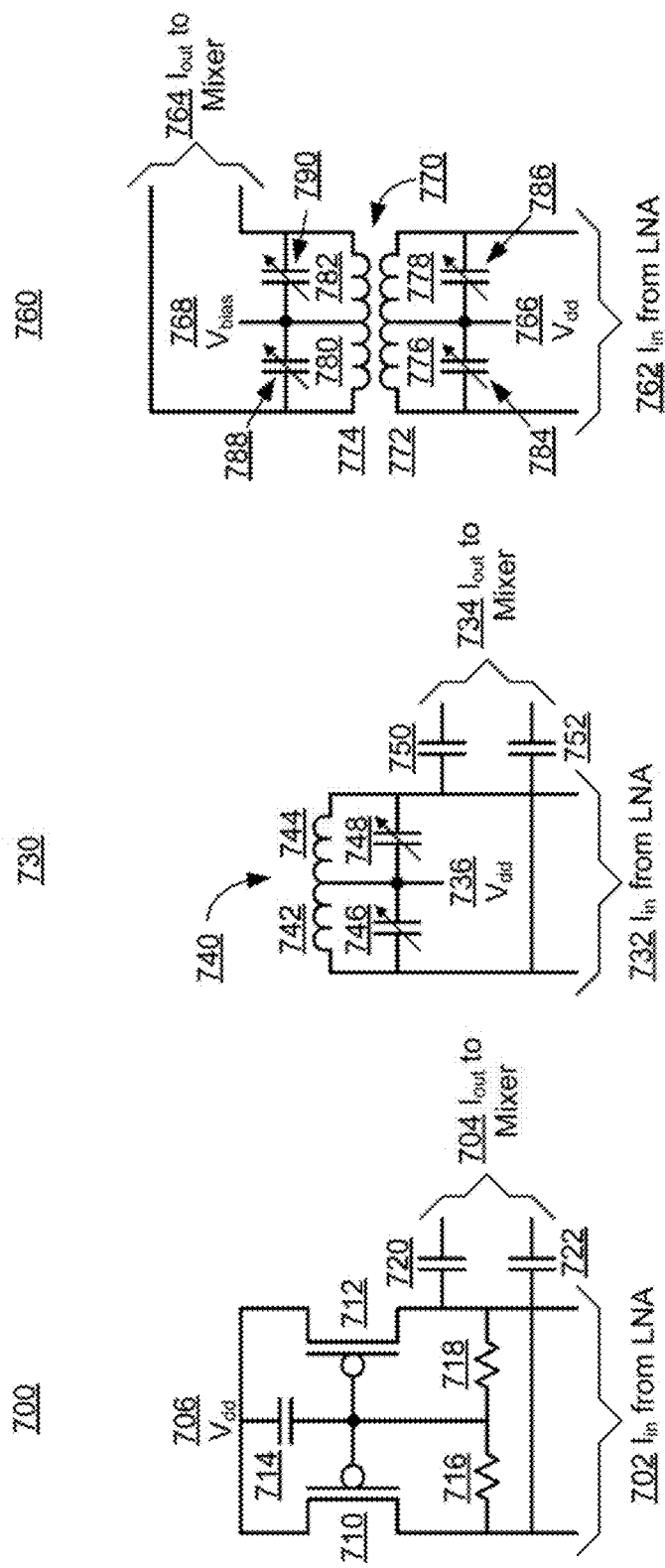
FIG. 7 depicts several horizontal low-noise amplifier mixer interface implementations.

Horizontal LNA-mixer interface 637 may be implemented in a number of ways. FIG. 7 depicts several horizontal low-noise amplifier mixer interface implementations. These implementations are different but have several features in common. Each of these implementations has a differential input connected to an LNA and a differential output connected to a mixer. The differential input receives an RF input signal $I_{in}$ from the LNA, and also provides to the LNA a DC supply current from $V_{dd}$ necessary for LNA operation, while preventing most of the RF input signal current from flowing to $V_{dd}$. The differential output provides most of the RF input signal $I_{in}$, either with or without gain, to the mixer while preventing DC current from $V_{dd}$ from flowing to the mixer.

Interface 700 uses two p-type metal oxide semiconductor (PMOS) transistors 710 and 712 configured to provide DC supply current to the LNA at part 702 and to present a relatively high impedance to the LNA at the RF signal frequency, which prevents the RF input signal at port 702 from flowing through the transistors 710 and 712. Resistors 716 and 718, which may have relatively high resistance, and filter capacitor 714 may form a low pass filter and bias network that uses negative feedback to bias transistors 710 and 712 at the DC current of the LNA. Capacitors 720 and 722 couple the RF input current from the LNA at port 702 to the mixer at port 704 and block DC current. In some embodiments, transistors 710 and 712 in interface 700 may be used only for DC biasing and may not provide any signal gain, yet may add noise. Interface 700, lacking large passive elements such as inductors, may occupy relatively little area in an integrated circuit. However, interface 700 may not provide any current gain, and may have relatively high noise as compared to other interface implementations.

Interface 730 uses inductors 742 and 744 to provide DC supply current to an LNA at port 732, inductors 742 and 744, together with capacitors 746 and 748, may also form parallel resonant LC networks that have relatively high impedance at the RF signal frequency. This prevents most of the RF input signal current at port 732 from flowing to $V_{dd}$. The values of capacitors 746 and 748 may be adjustable to allow for tuning of the resonant frequency of the LC networks. Capacitors 750 and 752 couple the RF input current from the LNA at port 732 to a mixer at port 734 and block DC current. Unlike interface 700, interface 730 does not contain active components and does not add noise to the RF signal. Interface 730 also may not be able to provide any current gain for reduction of the noise contribution from the mixer. Moreover, implementations of inductors 742 and 744 in an integrated circuit may be physically large and thus result in relatively high area and cost. In some embodiments, the inductor area can be reduced by configuring inductors 742 and 744 as the two sides of a single differential inductor 740.

Interface 760 uses primary windings 776 and 778 of transformer 770 to provide DC supply current to an LNA at port 762. Transformer 770 couples the RF input signal at port 762, which is connected to the transformer primary windings 776 and 778, to a mixer at port 764, which is connected to the transformer secondary windings 780 and 782. Transformer 770 blocks DC current from $V_{dd}$, which is connected to the primary center-tap, from flowing to the mixer. The secondary center-tap may be connected to a DC bias voltage $V_{bias}$ in some embodiments. Capacitors 784 and 786, connected in parallel with the transformer primary windings 776 and 778, and capacitors 788 and 790, connected in parallel with the transformer secondary windings 780 and 782, may be adjustable and may be used to tune the frequency response of transformer 700 to optimize signal gain and/or bandwidth. Interface 760 does not contain active components and does not add noise to the RF signal. Moreover, interface 760 may be configured to provide RF signal current gain by adjustment of the turns ratio of the transformer windings and their tuning, which may allow reduction of the effective noise contribution of the mixer relative to the increased signal current. However, implementations of transformer 700 in an integrated circuit may be physically large, similar to inductors 742 and 744, and may result in relatively high area and cost.

Figure 8:
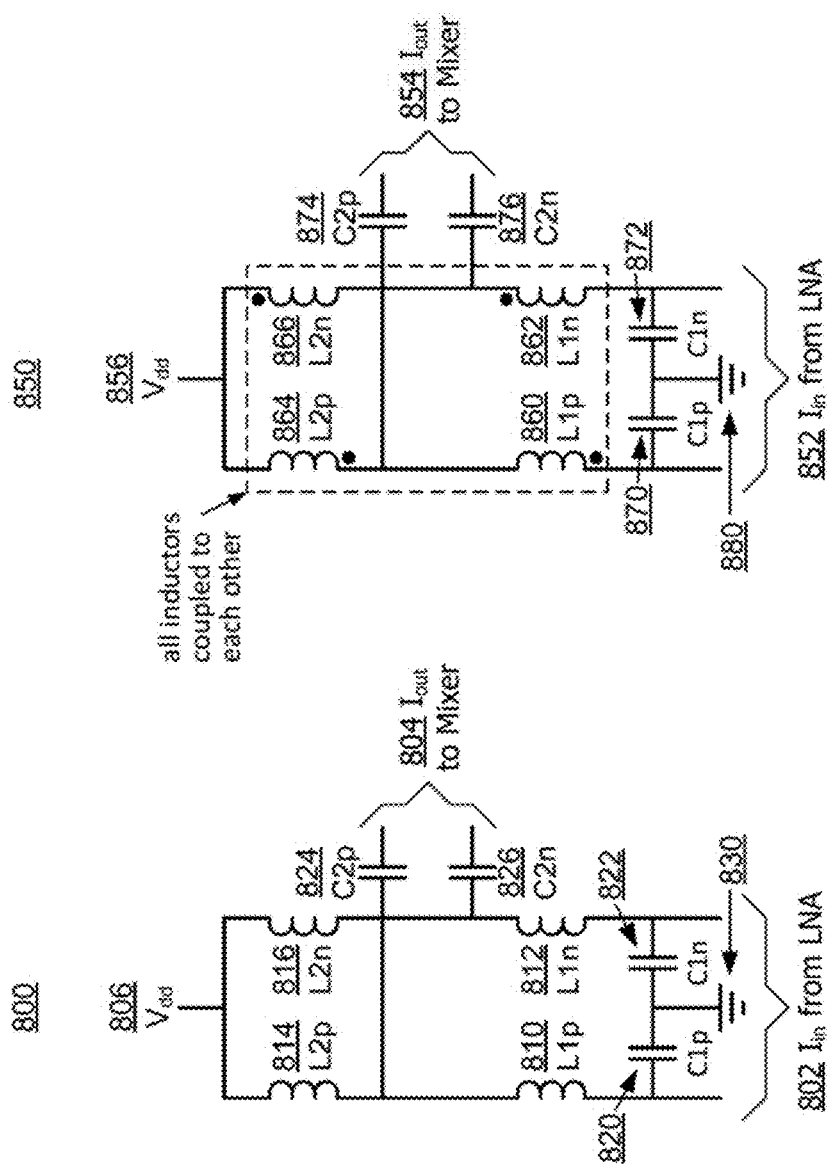
FIG. 8 depicts horizontal low-noise amplifier mixer interface implementations based on LC matching networks, according to embodiments.

In some embodiments, an LNA-mixer interface may be implemented using an LC matching network, which may be configured to provide current gain due to impedance transformation. FIG. 8 depicts horizontal low-noise amplifier mixer interface implementations based on LC matching networks, according to embodiments. Interface 800 is an LC matching network interface configured to couple to an LNA via port 802 and to a mixer via port 804, similar to the interfaces described above in FIG. 7. Interface 800 uses inductors 810, 812, 814, and 816 to provide DC supply current to the LNA at port 802. A differential LC RF matching network consisting of inductors L1p 810 and L2p 814 and capacitors C1p 820 and C2p 824 for one side of the differential RF signal, and inductors L1n 812 and L2n 816 and capacitors C1n 822 and C2n 826 for the other side of the differential RF signal, couples the RF input signal at port 802 to the mixer at port 804. Matching network capacitors 824 and 826 may prevent DC current from flowing from $V_{dd}$ and/or the LNA to the mixer. Matching network capacitors 820 and 822 may include the capacitance of the LNA output transistors. In some embodiments capacitors 820, 822, 824, and 826 may be adjustable, for example via digital control signals, and may be used to tune the matching network frequency response to optimize signal gain and/or bandwidth. The matching circuit may transform a relatively high impedance at the LNA output port 802 to a relatively low impedance at the mixer input port 804 over a frequency range that includes the RF signal frequency. The matching circuit contains only passive devices and does not add noise to the RF circuit, and also does not provide power gain. However, the matching circuit may provide RF signal current gain by transforming the impedance at the LNA output port 802 to a lower value, which may reduce the effective noise contribution of the mixer relative to the increased signal current. Each of the four inductors 810-816 in interface 800 is a separate device and is not intentionally magnetically coupled to any other inductor, although some unintentional stray coupling may occur. Interface 800 may occupy significant area due to the presence of inductors 810-816, even more than the area occupied by interface 760.

Interface 850 is another LC matching network interface configured to couple to an LNA via port 852 and to a mixer via port 854, and is similarly configured to interface 800. For example, inductors 860 and 862 may have first terminals coupled to respective terminals of port 852 and to capacitors 870 and 872, respectively, and may further have second terminals coupled to respective terminals of port 854 via capacitors 874 and 876, respectively. Capacitors 870 and 872 may be coupled to each other and to a reference node 880. Inductors 864 and 866 may in turn each have first terminals coupled to respective terminals of port 854 via capacitors 874 and 876, respectively, and to the second terminals of inductors 870 and 872, and may have second terminals coupled together and to supply voltage $V_{dd}$ 856. Capacitors 870-876, similar to capacitors 820-826, may also be adjustable.

However, instead of the separate inductors 810-816 used in interface 800, inductors 860-866 may be coupled inductors. This may allow interface 850 to occupy less area compared to interface 800, because the individual inductors 860-866 do not have to be implemented as physically separate inductors. Instead, the inductors 860-866 may be implemented in an integrated circuit as segments of a single inductor structure in which each inductor segment is DC coupled and magnetically coupled to the other segments. The inductors 860-866 are DC coupled together in that there exists a direct current pathway between each inductor and every other inductor, and are magnetically coupled in that a magnetic field generated by each inductor affects the magnetic field and current associated with every other inductor. The dots near one end of each of inductors 860-866 indicate the polarity of the magnetically-coupled RF signal voltages. The magnetic coupling between inductors may also reduce the inductor values required in the matching network, which further reduces the area required for the inductors. Interface 850 may otherwise provide the same features as interface 800, such as being relatively low noise, capable of providing current gain via impedance transformation, incorporating the output capacitance of the LNA on port 852, and providing DC isolation between the mixer on port 854 and the LNA on port 852.

In this disclosure, a reference potential is defined as a particular DC or RF voltage amplitude common to two or more signals, and a reference node (e.g., reference nodes 830 or 880) is defined as a circuit node or connection point at which a reference potential exists. A reference potential or reference node may be a ground, an RF ground, or a virtual ground. A ground may be defined as either a reference potential or a reference node for measuring single-ended voltages. The voltage of a single-ended signal, such as an RF signal, is defined and measured with respect to ground, whereas the voltage of a differential signal is defined and measured between the two sides (+ and −) of the differential signal. An RF ground may be defined as either a reference potential or a reference node for measuring single-ended RF signals. An RF ground may have a non-zero DC voltage, but may have a low RF impedance to ground and a nearly zero RF voltage. A virtual ground may be defined as either a reference potential or a reference node having a nearly zero signal voltage due to circuit behavior, such as due to a control circuit or due to active feedback. A particular reference node may be a virtual ground at a single signal frequency or over a range of signal frequencies. In some embodiments, circuits in this disclosure described as being coupled to a reference node may instead (or also) be coupled to a reference potential, and may also be coupled to two or more separate, different reference nodes or potentials.

The input and output ports of the interfaces in FIGS. 7 and 8 are depicted as differential ports having two terminals, each terminal configured to carry a particular side of a differential signal. In some embodiments, one or both of the input and output ports of an interface may instead be configured to carry single-ended signals, and may include a single terminal instead of multiple terminals.

Figure 9:
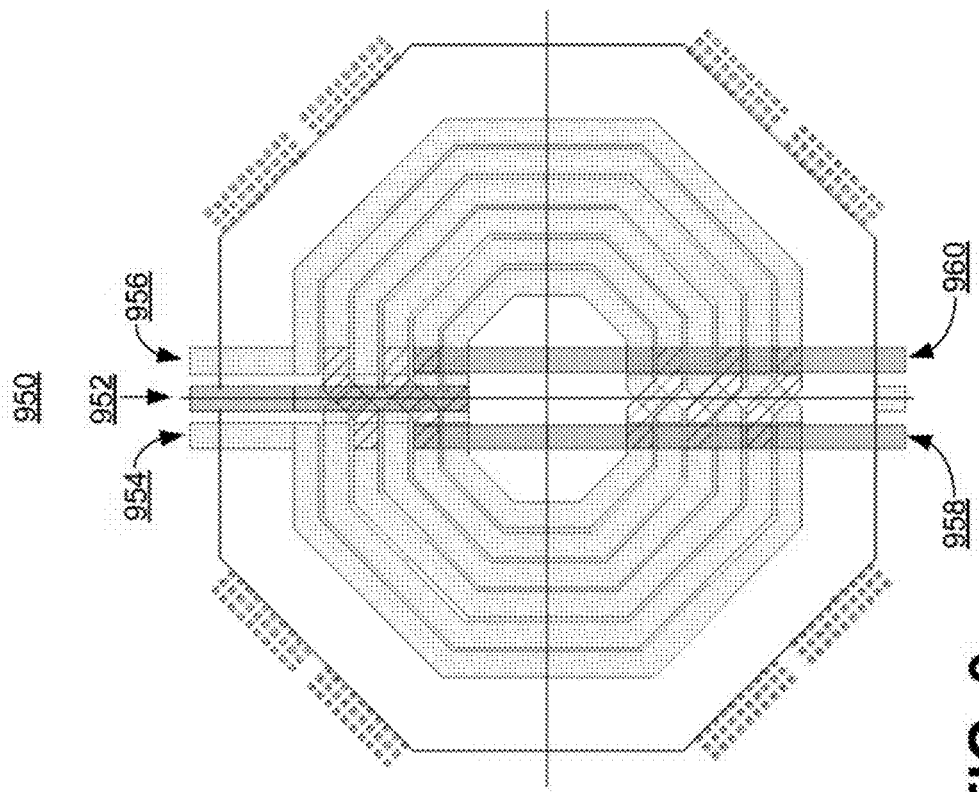
FIG. 9 depicts how multiple DC and magnetically coupled inductors may be implemented in an integrated circuit as segments of a single inductor structure.
Figure 9:
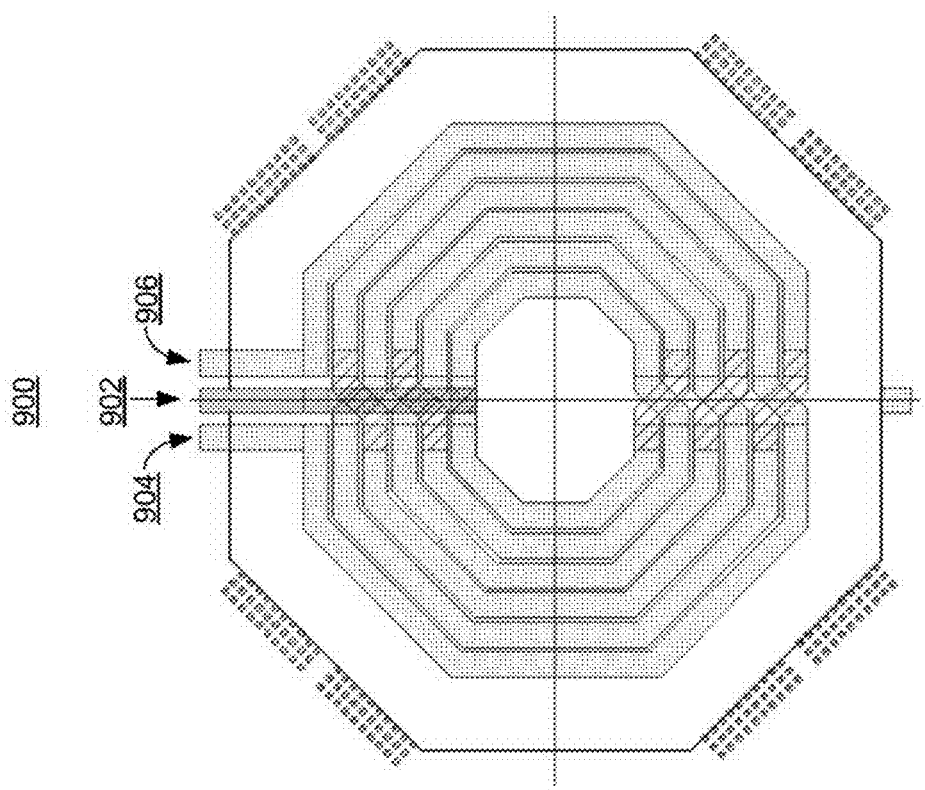

FIG. 9 depicts how multiple DC and magnetically coupled inductors may be implemented in an integrated circuit as segments of a single inductor structure. Inductor 900 is a symmetric center-tapped coupled inductor, with terminals 904 and 906 corresponding to opposite ends of inductor 900 and terminal 902 corresponding to a center tap coupled to the center of inductor 900. Inductor 950 is similar to inductor 900, with terminals 954 and 956 corresponding to opposite ends of inductor 950 and terminal 952 corresponding to a center tap coupled to the center of inductor 950. In addition, terminals 958 and 960 may be connected respectively to each side of inductor 950 to create two additional inductor segments. Accordingly, the four coupled inductors 860-866 may be implemented from inductor 950 with inductor 860 corresponding to the inductor segment between terminals 951 and 958, inductor 864 corresponding to the inductor segment between terminals 958 and 952, inductor 866 corresponding to the inductor segment between terminals 952 and 960, and inductor 862 corresponding to the inductor segment between terminals 960 and 956.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented individually and/or collectively, by a wide range of hardware, software, firmware, or virtually any combination thereof. Those skilled in the art will recognize that some aspects of the RFID embodiments disclosed herein, in whole or in part, may be equivalently implemented employing integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

I claim:

1. A Radio Frequency Identification (RFID) reader integrated circuit (IC) receiver front-end circuit (RFE) comprising:
    a low-noise amplifier (LNA);
    a mixer; and
    a horizontal matching circuit coupled from an output port of the LNA to an input port of the mixer, the matching circuit comprising a first inductor, a second inductor, and a third inductor, wherein:
    each inductor is magnetically coupled to each of the other inductors; and
    each inductor is direct-current (DC) coupled to each of the other inductors.

2. The RFE of claim 1, wherein at least one of the output port of the LNA and the input port of the mixer is differential.

3. The RFE of claim 1, wherein at least one of the output port of the LNA and the input port of the mixer is single-ended.

4. The RFE of claim 1, wherein the matching circuit includes a fourth inductor magnetically and DC coupled to each of the first, second, and third inductors.

5. The RFE of claim 1, wherein the LNA is one of a common-gate LNA and a common-source LNA.

6. The REF of claim 1, wherein the matching circuit includes at least one digitally adjustable capacitor.

7. The RFE of claim 1, wherein the first, second, and third inductors are implemented using segments of a single inductor implemented on an IC.

8. The RFE of claim 1, further comprising a self-jammer cancellation (SJC) module coupled to the LNA and configured to:
    receive an SJC input signal comprising a first signal of interest (SOI) and a first unwanted carrier signal (UCS); and
    provide an output SJC signal comprising a second SOI and a second UCS in which an amplitude ratio between the second UCS and the second SOI is substantially reduced relative to another amplitude ratio between the first UCS and the first SOI.

9. The RFE of claim 8, wherein the first SOI and the second SOI are substantially the same signal.

10. A low-noise amplifier (LNA) mixer interface for a Radio Frequency Identification (RFID) integrated circuit (IC), the interface comprising:
    an input port coupled to an LNA;
    an output port coupled to a mixer stage; and
    a matching circuit coupled to the input port and the output port, the matching circuit comprising a first inductor, a second inductor, and a third inductor, wherein:
    each inductor is magnetically coupled to each of the other inductors; and
    each inductor is direct-current coupled to each of the other inductors.

11. The interface of claim 10, wherein at least one of the input port and the output port is configured for a differential signal.

12. The interface of claim 10, wherein at least one of the input port and the output port is configured for a single-ended signal.

13. The interface of claim 10, wherein the matching circuit includes a fourth inductor, the fourth inductor magnetically and DC coupled to each of the first, second, and third inductors.

14. The interface of claim 10, wherein the matching circuit includes at least one digitally adjustable capacitor.

15. The interface of claim 10, wherein the first, second, and third inductors are implemented using segments of a single inductor implemented on the IC.

\* \* \* \* \*